United States Patent
Hwang et al.

(10) Patent No.: US 7,084,194 B2
(45) Date of Patent: *Aug. 1, 2006

(54) HALOGEN-FREE RESIN COMPOSITION

(75) Inventors: Kuen-Yuan Hwang, Hsinchu (TW); An-Pang Tu, Hsinchu (TW); Chi-Yi Ju, Hsinchu (TW); Wen-Tsai Tsai, Hsinchu (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/633,890

(22) Filed: Aug. 4, 2003

(65) Prior Publication Data

US 2004/0158023 A1  Aug. 12, 2004

(30) Foreign Application Priority Data

Oct. 25, 2002  (TW) ................ 91125399 A

(51) Int. Cl.
*C08L 63/00* (2006.01)
(52) U.S. Cl. .............. 523/435; 523/445; 523/451; 523/457; 523/461
(58) Field of Classification Search .......... 528/88, 528/89, 91, 93, 94, 95, 104, 106, 107, 116, 528/118, 119, 298, 403, 408, 409, 418, 421, 528/422, 423; 523/400, 451, 457, 461
See application file for complete search history.

(56) References Cited

U.S. PATENT DOCUMENTS

| | | | |
|---|---|---|---|
| 6,005,064 A | 12/1999 | Hirai et al. | |
| 6,900,269 B1 * | 5/2005 | Hwang et al. | 525/109 |
| 2004/0147640 A1 * | 7/2004 | Hwang et al. | 523/400 |

FOREIGN PATENT DOCUMENTS

JP  A-HEI-11-50123  2/1999

OTHER PUBLICATIONS

Copending application U.S. Appl. No. 10/412,126, filed Apr. 11, 2003.*

* cited by examiner

*Primary Examiner*—Michael J. Feely
(74) *Attorney, Agent, or Firm*—Fulbright & Jaworski L.L.P.

(57) ABSTRACT

A halogen-free resin composition is provided, comprising: (A) one or more phosphorous-containing epoxy resins; (B) a hardener; and (C) a hardening accelerator, wherein the hardener of component (B) has the structure represented by the following formula (I):

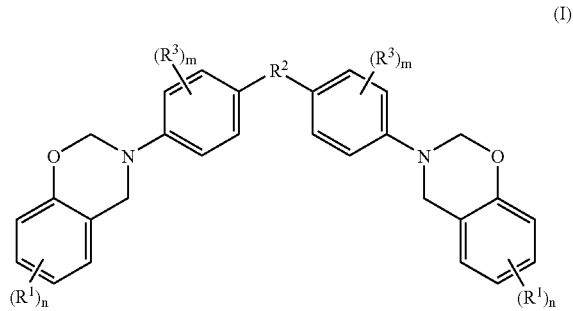

wherein, each symbol is defined as in the specification. The halogen-free resin composition of the present invention has excellent thermal resistance and flame retardant property, and is thereby suitably useful in the application of adhesives, composite materials, laminated plates, printed circuit boards, copper foil adhesives, inks used for build-up process, semiconductor packaging materials, and the like.

14 Claims, No Drawings

HALOGEN-FREE RESIN COMPOSITION

FIELD OF THE INVENTION

The present invention relates to a halogen-free epoxy resin composition. The flame retardant properties of the composition can reach the UL 94V-0 standard without adding a compound or resin component containing halogen, and the composition has high heat resistance.

BACKGROUND OF THE INVENTION

Because of easy processing, high safety, excellent mechanical and chemical properties, composite materials, especially the epoxy resin composite materials have been widely used in coatings, electrical insulation, building materials, adhesives and laminated entities. For instance, since epoxy resins have strong adhesion to reinforcement materials such as glass-fiber fabric, no volatility and small shrinkage of the forming product while hardening. A laminated plate produced by such resins has the advantage of a broad range of usability, good mechanical strength, good electrical insulation property, excellent resistance to chemicals and the like. The reliability of such a laminated plate has been increased, and such an epoxy resin laminated plate has been massively applied to electrical and electronic products.

However, since the demand for finer circuits and higher density of the printed circuit board increases day by day, it has been necessary to develop a laminated plate with better electrical and mechanical properties, as well as heat resistance during processing. For the FR4 laminated plate widely used at present, the glass transition temperature (Tg) after hardening is about 130° C. Thus, with the temperature over 200° C. during cutting and drilling, and even over 270° C. during the welding procedure during the printed circuit board process, the laminated plate breaks or cracks easily. The expansion of FR4 laminated plate in the direction of the plane is about 12 to 17 ppm/° C. For less than 100 μm of line width/line space of a developing printed circuit board, such a laminated plate is not suitably applied in HDI field. Therefore, various laminated plate materials that possess high heat stability and high glass transition temperature are being developed.

Another important property for laminated plates is flame retardance. The flame retardant properties of a printed circuit board are absolutely necessary to protect human life when the printed circuit board is used in traffic vehicles such as airplanes, automobiles, and public transportation vehicles. In order to enhance the flame retardant properties of the laminated plate, substances that can isolate the flame and reduce burning should be used. For laminated plates of the epoxy resin/glass-fiber series (or organic fiber series), halogen-containing compounds, especially bromine-containing epoxy resins and hardeners, are used in combination with flame retardants such as antimony trioxide and the like, so the flame retardant properties of the laminated plates can meet the required standard (such as the UL 94V-0 grade). Generally, for reaching the UL94V-0 standard, epoxy resins containing bromine as high as 17 to 21% in combination with antimony trioxide or other flame retardant are used. However, the use of flame retardants containing halogen and antimony trioxide can seriously affect the health of humans.

First, it has been reported that antimony trioxide is a carcinogenic substance. Additionally, erosive free radicals and hydrogen bromide generated by bromine burning, and also toxic furan bromides and a dioxin bromide compound produced from aromatic compounds with high bromine contents during burning seriously endanger human health and the environment. Therefore, it is most urgent to find a novel flame retardant material which solves the pollution and environmental problems caused by the current use of laminated products containing bromo-epoxy resins. And, since FR-4 epoxy glass fiber laminated plates are commonly used for electronic products, the requirement of flame retardant material is especially important.

Currently, phosphorus system compounds have been extensively studied and applied in the new generation of environment-friendly flame retardant materials, for example, red phosphorus or phosphorus-containing organic compounds (such as triphenyl phosphonate and tribenzyl phosphonate, etc.) are directly added to substitute halide compounds as a flame retarder to improve the flame resistance of polymer materials or hardening resin materials. However, direct addition of such flame retardant compounds in large amounts into resins is always required to achieve the effect of flame retardancy. Due to the smaller molecular weight of the compound, higher migration will affect the properties of resin substrates, for example, electronic properties, adhesive strength, and the like, resulting in difficulty in application.

Therefore, in the halogen-free resin composition of the present invention, a phosphorus-containing epoxy resin (particularly, a side chain type phosphorus-containing epoxy resin) and a hardener having the benzoxazine cyclic structure are used. The flame retardant properties of such a resin composition can meet the UL 94V-0 standard without adding a halogen-containing compound or resin, and such a resin composition has higher heat resistance relative to other resin compositions comprising a conventional hardener.

Generally, compounds having the benzoxazine cyclic structure are prepared by the reaction of a phenolic compound, an amine compound, and an aldehyde compound. But many patents disclose the method for preparing the compounds having the benzoxazine cyclic structure, which are prepared by the reaction of aniline and phenolic compound. For example, U.S. Pat. No. 6,005,064 disclosed a thermosetting resin having the benzoxazine cyclic structure prepared by the reaction of a phenolic resin, formaldehyde and aniline; and JP-A-Hei-11-50123 also disclosed the method for preparing dihydrobenzoxazine thermosetting resin from bisphenol, aniline, and formalin using methyl ethyl ketone as a solvent. However, the aniline used in these preparation methods is toxic, and is a forbidden chemical by law. Also, the preparation methods cannot meet the requirements of the mass production in industry.

Therefore, the present inventors have conducted extensive studies and have found that the system was endowed with relatively high stability when using hydrocarbon solvent to conduct the reaction of phenolic compounds, aromatic diamines, and aldehyde compounds. In addition to not using toxic aniline as a reactant, compounds having the benzoxazine cyclic structure conducts the ring-reopening polymerization at high temperature due to improper temperature control can be prevented. Meanwhile, the present invention can prevent the gelation or agglomeration caused by using high polar solvent or protic solvent to undergo the reaction. Therefore, the present invention is useful in mass production in industry.

SUMMARY OF THE INVENTION

The present invention provides a halogen-free resin composition comprising (A) one or more phosphorus-containing epoxy resins; (B) a hardener; (C) a hardening accelerator, wherein the hardener of component (B) has the structure represented by the following formula (I):

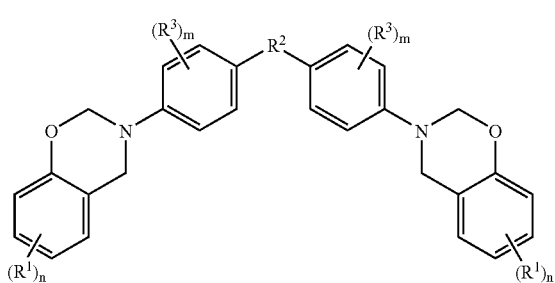

wherein each symbol is as defined in detailed description that follows. The halogen-free resin composition of the present invention has superior heat resistance and flame retardance property without adding a halogen-containing component in the composition, solving the pollution and environmental problems caused by using the conventional halogen-containing flame retardant resin composition.

DETAILED DESCRIPTION OF THE INVENTION

The present invention provides a halogen-free resin composition comprising (A) one or more phosphorus-containing epoxy resins; (B) a hardener; (C) a hardening accelerator, wherein the hardener of component (B) has the structure represented by the following formula (I):

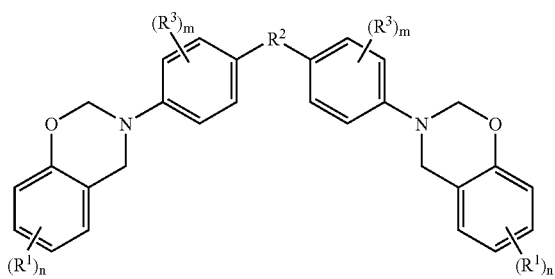

wherein $R^1$ represents a compound selected from the group consisting of an alkyl group, an alkenyl group, an alkoxy group, a hydroxy group and an amino group; $R^2$ represents a compound selected from the group consisting of a chemical bond, an alkylene group, O, S and $SO_2$; $R^3$ represents H or an alkyl group; m and n are integer from 0 to 4.

In the structure represented by the above formula (I), the alkyl group represented by $R^1$ and $R^3$ means linear, branched or cyclic alkyl of 1 to 6 carbon atoms. Examples thereof include, but are not limited to, methyl, ethyl, n-propyl, isopropyl, n-butyl, isobutyl, s-butyl, t-butyl, amyl, 2-amyl, 3-amyl, 2-methyl-1-butyl, isoamyl, s-amyl, 3-methyl-2-butyl, neo-amyl, hexyl, 4-methyl-2-amyl, cyclopentyl, cyclohexyl, and the like. Alkoxy group means linear, branched or cyclic alkoxyl of 1 to 6 carbon atoms. Examples thereof include, but are not limited to, methoxy, ethoxy, propoxy, isopropoxy, butoxy, isobutoxy, s-butoxy, t-butoxy, amoxy, isoamoxy, neo-amoxy, hexoxy, cyclohexoxy, and the like.

Alkylene group means linear, branched or cyclic alkylene group of 1 to 6 carbon atoms. Examples thereof include, but are not limited to methylene, ethylene, propylene, butylene, amylene, hexylene, 2-methylpropylene, 2,2'-dimethylpropylene, hexylene, 2,3-dimethylbutylene, and the like.

The azaoxa heterocyclic compound having the structure represented by the formula (I) is prepared by the reaction of a phenolic compound, an aromatic diamine compound, and an aldehyde compound in the presence of a solvent. The phenolic compound may be a substituted or unsubstituted phenolic compound, and examples of the substituents include, but are not limited to, an alkyl group, an alkenyl group, an alkoxyl group, a hydroxy group, and an amino group.

Examples of the above substituted or unsubstituted phenolic compounds include, but are not limited to, o-cresol, p-cresol, m-cresol, ethylphenol, propylphenol, isopropylphenol, butylphenol, s-butylphenol, t-butylphenol, amylphenol, isoamylphenol, hexylphenol, cyclohexylphenol, allylphenol, 4-methoxyphenol, 3-methoxyphenol, 2-methoxyphenol, 4-vinylphenol, 3-vinylphenol, 2-vinylphenol, 4-hydroxyphenol, 3-hydroxyphenol, 2-hydroxyphenol, 4-aminophenol, 3-aminophenol, 2-aminophenol, 4-hydroxycresol, 3-hydroxycresol, 2-hydroxycresol, 4-hydroxymethyl-2-methoxyphenol, 4-hydroxymethyl-3-methoxyphenol, 4-isopropyl-2-methoxyphenol, 4-isopropyl-3-methoxyphenol, 2-hydroxy-4-isopropylphenol, 3-hydroxy-4-isopropylphenol, 4-vinyl-2-methoxyphenol, 4-vinyl-3-methoxyphenol, 4-vinyl-2-hydroxyphenol, 4-vinyl-3-hydroxyphenol and the like.

The phenolic compounds used for preparing the azaoxa heterocyclic compound represented by the formula (I) are not particularly limited. The phenolic compounds can be mono-functional phenolic compounds, bi-functional phenolic compounds and multi-functional phenolic compounds, provided that at least one of hydrogen atoms on ortho-positions to the hydroxy group in the aromatic ring is unsubstituted.

The aromatic diamine compounds used for preparing the azaoxa heterocyclic compound represented by the following formula (I) are represented by the following formula (II):

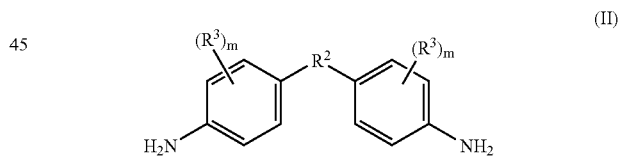

wherein $R^2$, $R^3$ and m are as defined above.

Examples of the aromatic diamine compounds represented by the formula (II) include, but are not limited to, diaminobiphenyl compounds, for example, 4,4'-diaminobiphenyl, 4,4'-diamino-2,2'-dimethylbiphenyl, 4,4'-diamino-2-butyl-3-methylbiphenyl, 4,4'-diamino-2-ethyl-3-isopropylbiphenyl, 4,4'-diamino-2-methyl-3-propylbiphenyl, 4,4'-diamino-2-methylbiphenyl, 4,4'-diamino-3-isopropylbiphenyl and the like; the diaminodiphenylalkane compounds, for example, 4,4'-diaminodiphenylmethane, 4,4'-diaminodiphenylethane, 4,4'-diaminodiphenylpropane, 4,4'-methylene bis(2-methylaniline), 4,4'-ethylene bis(3-isopropylaniline), 4,4'-methylene bis(2,6-dipropylaniline), 4,4'-ethylene bis(2,5-dibutylaniline), 4,4'-methylene bis(2-ethyl-6-propylaniline), 4,4'-methylene bis(2-isopropyl-6-methylaniline) and the like; the diaminodiphenyl ether compounds, for example, 4,4'-diaminodiphenylether, di(4-amino-3-ethylphenyl)ether, di(4-amino-3-hexylphenyl)ether, di(4-amino-3,5-dimethylphenyl)ether and the like; the diaminodiphenyl thioether compound, for example, 4,4'-diaminodiphenyl thioether, di(4-amino-3-propylphenyl)thioether, di(4-amino-3-t-butylphenyl)thioether, di(4-amino-3,5-diethylphenyl)thioether and the like; the diaminodiphenyl sulfone compounds, for example, 4,4'-diaminodiphenyl sulfone, di(4-amino-3-isopropylphenyl)sulfone, di(4-amino-3,5-diamylphenyl)sulfone and the like.

The aldehyde compounds used for preparing the azaoxa heterocyclic compounds represented by the formula (I) are not particularly limited, provided that aldehyde compounds are used for preparing the azaoxa heterocyclic compound having the benzoxazine cyclic structure. Examples of the aldehyde compound include, but not limited to, aldehyde (or vapor thereof), paraformaldehyde, polyoxymethylene and the like.

The azaoxa heterocyclic compounds represented by the formula (I) are prepared by the polymerization of a phenolic compound, an aromatic diamine compound, and a aldehyde compound, wherein the phenolic compound, the aromatic diamine compound and the aldehyde compound used in the polymerization are present in an equivalent ratio of 2:1:4.

The solvent used for preparing the azaoxa heterocyclic compounds represented by the formula (I) are not particularly limited, provided that all the reactants can be suitably dissolved in the solvent. Examples of the solvent include, but are not limited to, alcohol solvents such as methanol, ethanol, propanol, isopropanol, ethandiol and the like; ether solvents such as 1,2-dimethoxyethane, tetrahydrofuran, dioxane and the like; ketone solvents such as acetone, methyl ethyl ketone, methyl isopropyl ketone and the like; ester solvents such as methyl acetate, ethyl acetate, and the like; and hydrocarbon solvents such as toluene, xylene, and the like. In comparison to the above polar solvents, the hydrocarbon solvents used in the present invention have relatively low polarity. The hydrocarbon solvent used can not only dissolve the phenolic compound and the aromatic diamine compound, but also it can scatter the aldehyde compound so that the agglomeration does not easily occur. Therefore, the stability of the reaction system is enhanced, and thus the formed azaoxa heterocyclic compounds having the benzoxazine cyclic structure will not further undergo ring-opening polymerization at very high temperature caused by the improper temperature-control. Therefore, the preferred solvent used in the present invention is a hydrocarbon solvent.

In the halogen-free resin composition of the present invention, the phosphorus-containing epoxy resins (component A) are not limited, and they can be any phosphorus-containing epoxy resin. Among them, a side chain type phosphorus-containing epoxy resin is preferred. The preferred examples of the side chain type phosphorus-containing epoxy resin include, but are not limited to:

(1) The side chain type phosphorus-containing epoxy resin prepared by directly introducing the organic cyclic phosphorus-containing compound (for example, 9,10-dihydro-9-oxa-10-phosphorylphenanthrene-10-oxide, (hereinafter referred to as HCA)) into the structure of the epoxy resin, and is represented by the following formula (III):

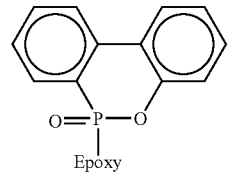

wherein Epoxy represents an epoxy resin in which at least one of epoxy groups is ring-opened; and (2) initially reacting the organic cyclic phosphorus-containing compound HCA and the aromatic aldehyde compound with the aromatic compound having reactive hydrogens to form a multi-functional phosphorus-containing compound (the phosphorus-containing compound has bisphenol-like structure, the difference in structure between them being one hydrogen or organic group in the center of the phosphorus-containing compound structure being substituted with HCA), then undergoing the additive reaction of the multi-functional phosphorus-containing compound and epoxy resin to introduce the phosphorus-containing compound into the structure of the epoxy resin to form a side chain type phosphorus-containing epoxy resin represented by the following formula (IV):

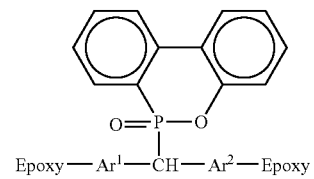

wherein Epoxy is as defined above; and $Ar^1$ and $Ar^2$ are independently selected from:

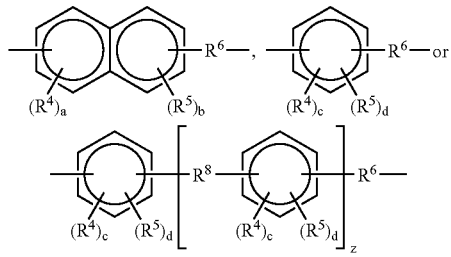

wherein $R^4$ is selected from the group consisting of —OH, —COOH, —NH$_2$, —CHO, —SH, —SO$_3$H, —CONH$_2$, —NHCOOR$^7$ and an anhydride; $R^5$ is selected from the group consisting of hydrogen, an alkyl group, an alkoxyl group, a nitro group and an aromatic group; $R^6$ is selected from the group consisting of a bond or an alkylene group; $R^7$ is H or alkyl group; $R^8$ is selected from the group consisting of a bond, —CR$^5$R$^7$—, —O—, —CO—, —S—, —SO— and —SO$_2$—; a and b are independent integers from 0 to 6, and a+b≦6; c and d are independent integers from 0 to 4, and c+d≦4; and z is an integer from 1 to 20.

Examples of an alkyl group, an alkylene group and an alkoxy group represented by the above $R^5$, $R^6$ and $R^7$ are as defined above. Examples of an aromatic group represented by $R^5$ include phenyl, tolyl, xylyl, benzyl, naphthylm, and the like.

In the halogen-free resin compound, a side chain type phosphorus-containing epoxy resin represented by the formula (III) or the formula (IV) prepared by undergoing the additive reaction of any epoxy resin and the organic cyclic phosphorus-containing compound HCA or the phosphorus-containing compound made from HCA is used as one or more phosphorus-containing epoxy resins (component A). An example of the epoxy resin include, but are not limited to, bi-functional epoxy resin. The so-called "bi-functional epoxy resin" means the resin has two or more epoxy groups per molecule, for example, the epoxy groups formed by the oxidation of olefin, the glycidyl etherification of hydroxy groups, glycidyl amination of primary and secondary amines, or glycidyl esterification of carboxylic acids.

The compounds used for undergoing such a epoxidation include catechol, resorcinol, hydroquinone, and the like; bisphenols such as 2,6-hydroxynaphthalene, 2,2-bis(4-hydroxyphenyl)propane (i.e. bisphenol A), 2-(3-hydroxyphenyl)-2-(4'-hydroxyphenyl)propane, bis(4-hydroxyphenyl) methane (i.e. bisphenol F), bis(4-hydroxyphenyl)sulfone (i.e. bisphenol S), bis(4-hydroxyphenyl)thioether, bis(4-hydroxyphenyl)toluene, bis(4-hydroxyphenyl)methylcyclohexane, 4,4'-dihydroxybiphenyl, 4,4'-dihydroxy-3,3',5,5'-tetramethyl-biphenyl, 4,4'-dihydroxybiphenyl ether, 6,6'-dihydroxy-3,3,3',3'-tetramethyl-1,1-spirodiindan and 1,3,3-trimethyl-1-(4-hydroxyphenyl)-1-indan-6-ol and the like; oligophenols such as tetraphenolicethane, naphthaleneolcresol resol resin phenolic resin, and the like; phenolic resin such as phenol-aldehyde resin, phenol aromatic alkyl group, naphthaleneol aromatic alkyl group, phenol-bicyclopentdiene copolymer resin, and the like; aliphatic and aromatic amine such as ethylene diamine, propylene diamine, hexamethylene diamine, aniline, 4,4'-diaminodiphenylmethane (MDA), 4,4'-diaminodiphenyl ether, 4,4'-diaminodiphenyl sulfone, 2,2'-bis(4,4'-diaminophenyl)propane, m-xylyl diamine, p-xylyl diamine, 1,2-diaminocyclohexane, aniline aromatic alkyl resin, and the like; aminophenols such as m-aminophenol, p-aminophenol, 2-(4-aminophenyl)-2-(4'-hydroxyphenyl)propane, 4-aminophenyl-4-hydroxyphenylmethane and the like; carboxylic acids such as phthalic acid, isophthalic acid, p-phthalic acid, tetrahydrophthalic acid, hexahydrophthalic acid, dimeric acid, 1,3-dicarboxycyclohexane and the like; and hydroxycarboxylic acids such as salicyclic acid and 4-hydroxybenzoic acid.

In the halogen-free resin composition of the present invention, the preferred epoxy resin composition used in forming a side chain type phosphorus-containing epoxy resin is glycidyl ethers. Examples of monomers for the epoxy resin include: bisphenol glycidyl ether, biphenyl glycidyl ether, benzenediol glycidyl ether, nitrogen-containing hetero-ring glycidyl ether, dihydroxynaphthalene glycidyl ether, phenolic glycidyl ether, polyhydric phenol glycidyl ether, and the like.

Examples of bisphenol glycidyl ether include: bisphenol A glycidyl ether, bisphenol F glycidyl ether, biphenyol AD glycidyl ether, bisphenol S glycidyl ether, tetramethyl-bisphenol A glycidyl ether, tetramethylbisphenol F glycidyl ether, tetramethylbisphenol AD glycidyl ether, tetramethyl-bisphenol S glycidyl ether, and the like.

Examples of biphenol glycidyl ether include: 4,4'-biphenol glycidyl ether, 3,3'-dimethyl-4,4'-biphenol glycidyl ether, 3,3',5,5'-tetramethyl-4,4'-biphenol glycidyl ether, and the like.

Examples of benzenediol glycidyl ether include: resorcinol glycidyl ether, hydroquinone glycidyl ether, isobutylhydroquinone glycidyl ether, and the like.

Examples of nitrogen-containing hetero-ring glycidyl ether include: triglycidyl ether of isocyanurate, triglycidyl ether of cyanurate, and the like.

Examples of dihydroxynaphthalene glycidyl ether include: 1,6-dihydroxynaphthalenediglycidyl ether, 2,6-dihydroxynaphthalenediglycidyl ether, and the like.

Examples of phenolic polyglycidyl ethers include: phenolic polyglycidyl ether, cresol phenolic polyglycidyl ether, bisphenol A phenolic polyglycidyl ether, and the like.

Examples of phenylpolyhydric phenol glycidyl ether include: tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris(3-methyl-4-hydroxyphenyl)methane polyglycidyl ether, tris(3,5-dimethyl-4-hydroxyphenyl)methane polyglycidyl ether, tetrakis(4-hydroxyphenyl)ethane polyglycidyl ether, tetrakis(3,5-dimethyl-4-hydroxyphenyl)ethane polyglycidyl ether, dicyclopentene-phenolic polyglycidyl ether, and the like.

The additive reaction for preparing a side chain type phosphorus-containing epoxy resin represented by the formula (III) or formula (IV) can be conducted in molten state without solvent, or in reflux with solvent. Examples of the solvent used in reflux include, but not limited to: organic aromatics solvents such as toluene, xylene and the like; ketones such as acetone, methyl ethyl ketone, methyl isobutyl ketone and the like; ethers such as ethylene glycol monomethyl ether, propylene glycol monomethyl ether and the like; esters such as ethyl acetate, ethyl isopropionate, propylene glycol monomethyl ether acetate and the like; hydrocarbons such as toluene and xylene and the like; and aprotic solvent such as N,N-dimethylformamide, N,N-diethylformamide, dimethylsulfoxide, and the like.

The reaction for preparing a side chain type phosphorus-containing epoxy resin represented by the formula (III) or formula (IV) typically is carried out at a temperature of 50 to 350° C., preferably 50 to 300° C., more preferably 100 to 250° C., and still more preferably 100 to 200° C. Side reaction tends to occur and the reaction rate is not easily controlled if the temperature is higher than 350° C., which will speed up the deterioration of the resin. On the other hand, the efficiency of the reaction gets worse and the formed resin cannot be applied in the high temperature environment if the reaction temperature is lower than 50° C.

In the halogen-free resin composition of the invention, these phosphorus-containing epoxy resins can be used singly or in combination as a mixture of two or more different kind of resins. One or more phosphorus-containing epoxy resins (component A) are typically used in an amount of 40 to 80 percent by weight, preferably 50 to 80 percent by weight, and more preferably 60 to 80 percent by weight based on the total amount of the phosphorus-containing epoxy resins (component A) and the hardener (component B). If the amount of one or more phosphorus-containing epoxy resins (component A) is smaller than 40 percent by weight, the heat resistance and the flame retardant property of the product after hardening tend to be insufficient, which is not beneficial in application.

In the halogen-free resin composition of the invention, examples of the hardening accelerator (component C) include: tertiary amine, tertiary phosphine, quaternary ammonium salt, quaternary phosphonium salt, boron trifluoride complex salt, lithium-containing compound, imidazole compound or mixtures thereof.

Examples of the tertiary amines include: triethylamine, tributylamine, dimethylaniline, diethyl aniline, α-methyl-benzyldimethylamine, dimethylaminoethanol, N,N-dimethyl-aminocresol, tris(N,N-dimethyl-aminomethyl)phenol, and the like.

An examples of tertiary phosphines includes triphenylphosphine.

Examples of quaternary ammonium salt include: tetramethylammonium chloride, tetramethylammonium bromide, tetramethylammonium iodide, tetraethylammonium chloride, tetraethylammonium bromide, tetrabutylammonium iodide, tetrabutylammonium chloride, tetrabutylammonium bromide, tetrabutylammonium iodide, triethylbenzylammonium chloride, triethylbenzylammonium bromide, triethylbenzylammonium iodide, triethylphenylethylammonium chloride, triethylphenylethylammonium bromide, triethylphenylethylammonium iodide, and the like.

Examples of quaternary phosphonium salt include: tetrabutylphosphonium chloride, tetrabutylphosphonium bromide, tetrabutylphosphonium iodide, tetrabutylphosphonium acetate, tetraphenylphosphonium chloride, tetraphenylphosphonium bromide, tetraphenylphosphonium iodide, ethyltriphenylphosphonium chloride, ethyltriphenylphosphonium bromide, ethyltriphenylphosphonium iodide, ethyltriphenylphosphonium acetate, ethyltriphenylphosphonium phosphate, propyltriphenylphosphonium chloride, propyltriphenylphosphonium bromide, propyltriphenylphosphonium iodide, butyltriphenylphosphonium chloride, butyltriphenylphosphonium bromide, butyltriphenylpbosphonium iodide, and the like.

Examples of imidazole compound include: 2-methylimidazole, 2-ethylimidazole, 2-laurylimidazole, 2-heptadecylimidazole, 2-phenylimidazole, 4-methylimidazole, 4-ethylimidazole, 4-laurylimidazole, 4-heptadecylimidazole, 2-phenyl-4-methylimidazole, 2-phenyl-4-hydroxymethylimidazole, 2-ethyl-4-methylimidazole, 2-ethyl-4-hydroxymethylimidazole, 1-cyanoethyl-4-methylimidazole, 2-phenyl-4,5-dihydroxymethylimidazole, and the like.

These hardening accelerators can be used singly or in combination as a mixture of two or more different kind of hardening accelerators. Among them, the hardening accelerator is preferably the imidazole compound and the quaternary phosphonium salt, preferably 2-methylimidazole, 2-phenylimidazole, ethyltriphenylphosphonium acetate, butyltriphenylphosphonium bromide or mixtures thereof.

In the halogen-free resin composition of the invention, the hardening accelerator is used in an amount of 0.01 to 1 percent by weight, preferably 0.01 to 0.5 percent by weight, and more preferably 0.02 to 0.1 percent by weight relative to the total weight of the resin composition.

The flame retardant resin composition of the invention can be formulated into varnish. The viscosity of the resin composition can be adjusted by the addition of a suitable solvent when the resin composition of the invention is formulated into varnish. The viscosity of the resin composition is preferably in the range of 20 to 500 cps/25° C.

The solvents used for adjusting the viscosity of the resin composition include organic aromatic solvents, protic solvents, ketones, ethers, esters, and the like.

Examples of the organic aromatic solvents include toluene and xylene; examples of protic solvents include N,N-dimethylformamide, N,N-diethylformamide, dimethylsulfoxide and the like; examples of ketones include acetone, methyl ethyl ketone, methyl isobutyl ketone and the like; examples of ethers include ethylene glycol monomethyl ether, propylene glycol monomethyl ether and the like; and examples of esters include ethyl acetate, ethyl isopropionate, propylene glycol monomethyl ether acetate, and the like.

Optional additives or modifiers used in the halogen-free resin composition of the invention include heat stabilizers, light stabilizers, UV assorbents, plasticizers, and the like.

The halogen-free resin composition of the invention can be:

A laminate manufactured by a copper foil, a fiber substrate, and the resin composition of the invention using a method known in the art.

The prepreg can be manufactured by impregnating a suitable substrate with varnish formulated by the halogen-free resin composition of the invention and drying the impregnated substrate with heat. Examples of these substrates include, but are not limited to, fiber substrate, such as, glass fiber, metallic fiber, carbon fiber, aramide fiber, PBO fiber, LCP fiber, Kelvar fiber, aromatic ester, boron, cellulose and the like; mat substrate, for example, glass fiber cloth; and paper substrate, such as, aramide paper, LPC paper, and the like. The prepreg can be further made into composite material laminated plates, or it can be used alone in a binding layer of prepregs. Additionally, copper foil is placed on one or both surfaces of a prepreg or a combination of prepregs, which is then pressurized and heated to obtain a laminate plate. The laminated plate thus obtained is by far superior to the standards of the present products on the market in respect to size stability, resistance to chemicals, resistance to corrosion, moisture absorption, and electrical properties, and it is suitable in producing electrical products for electronics, space applications and transport vehicles, for example, in producing printed circuit boards, multi-layer circuit boards, and the like.

The hardening reaction for the halogen-free resin composition of the invention is typically carried out at a temperature of 20 to 350° C., preferably 50 to 300° C., more preferably 100 to 250° C., and still more preferably 120 to 220° C. Side reaction tends to occur and the hardening reaction rate is not easily controlled if the hardening reaction temperature is too high, which will speed up the deterioration of the resin. On the other hand, the efficiency of the hardening reaction decreases and the formed resin cannot be applied in a high temperature environment if the hardening reaction temperature is too low.

The flame retardant properties of the halogen-free resin composition of the invention can reach the UL 94V-0 standard without adding other processing aids and flame retardant additives, especially halogen, and the resin composition has high heat resistance and an excellent dielectric property.

The features and the effects of present invention will be described in more detail by way of examples, which should not be construed as limiting the scope of the invention.

EXAMPLES

Each component used in the examples and the synthesis examples is illustrated as following:

Epoxy resin 1 represents a diglycidyl ether of bisphenol A, sold under trade name BE188EL and manufactured by Chang Chun Plastics Co., Ltd., Taiwan. The epoxy equivalent weight thereof is in the range of 185 to 195 g/eq. The hydrolytic chlorine content is below 200 ppm, and the viscosity is in the range of 11000 to 15000 cps/25° C.

Epoxy resin 2 represents a polyglycidyl ether of cresolaldehyde concentrate, sold under trade name CNE200ELF and manufactured by Chang Chun Plastics Co., Ltd., Taiwan. The epoxy equivalent weight thereof is in the range of 200 to 220 g/eq, and the hydrolytic chlorine content is below 700 ppm (measured by ASTM method).

Hardener A represents a solution of 10% dicyandiamide (DICY) in DMF.

Hardener B represents a solution of 10% 4,4'-diaminosulfoxide (DDS) in DMF.

Hardening accelerator A represents a solution of 10% 2-methylimidazole (2MI) in methyl ethyl ketone.

The epoxy equivalent weight (EEW), the varnish viscosity, and solid content herein are measured by the following method:

(1) Epoxy equivalent weight: the epoxy resin is dissolved in a mixed solvent (chlorobenzene:chloroform=1:1), then the mixture is titrated with HBr/glacial acetic acid. EEW is determined according to the method in ASTM D1652. The indicator used is crystal violet.

(2) Viscosity: the varnish of the epoxy resin composition is placed into a thermostat at 25° C. for 4 hours, and the viscosity is measured by a Brookfield viscometer at 25° C.

(3) Solid content: After baking 1 g of the varnish sample containing the epoxy resin composition at 150° C. for 60 minutes, the non-volatile components in percent byweight are determined, which is the solid content.

Synthesis Example 1

216 g of a dried 9,10-dihydro-9-oxa-10-phosphorylphenanthrene-10-oxide (hereinafter is referred to the organic cyclic phosphorus-containing compound, HCA) was charged into a 3000 mL of five-neck glass autoclave equipped with an electrically-heating mantle, a temperature-controlling apparatus, an electrically-driving stirrer, a stirring bar, a thermocouple, a water-cooling condenser and an addition funnel, and then HCA was dissolved by heating under stirring in the glass autoclave. After heated up to 110° C., 112 g of 4-hydroxybenzaldehyde and 940 g of phenol were added. The reaction is conducted for at least 3 hours. Subsequently, the unreacted phenol was recovered. The product was washed with methanol after the reaction had completed. After cooling to room temperature, the product was filtered and dried, and 9,10-dihydro-9-oxa-10-phosphorylphenanthrene-10-oxide-10-yl)-(4-hydroxyphenyl)methanol (hereinafter referred to as the phosphorus-containing compound, HPP was obtained.

1000 g of epoxy resin 1 and 550 g of phosphorus-containing compound HPP were charged into a 3000 mL five-neck glass autoclave equipped with an electrically-heating mantle, a temperature-controlling apparatus, an electrically-driving stirrer, a stirring bar, a nitrogen inlet, a thermocouple, a water-cooling condenser and an addition funnel, and then the temperature was raised up to 120° C. under nitrogen atmosphere. After the epoxy resin 1 and the phosphorus-containing compound HPP had completely dissolved, the reactants were dried under a vacuum. Afterwards, nitrogen was let in and then the container was evacuated again, which was repeated twice. After the temperature of the autoclave was cooled to 85 to 90° C., 6.0 g of triphenylphosphine was added. The epoxy resin and triphenylphosphine were stirred by stirrer, and nitrogen was let in. Then, the mixture was heated up to 160° C. and maintained for 10 minutes. After the reaction had released heat slowly, the temperature was raised up to 180° C. and maintained for 3 hours. Then the phosphorus-containing epoxy resin A was obtained. The theoretical value of the epoxy equivalent weight of the phosphorus-containing epoxy resin A was 582, and the found value was 605; and the theoretical phosphorus content was 2.66 percent by weight. 1035 g of propylene glycol monomethyl ether was added into the obtained phosphorus-containing epoxy resin A to dissolve the phosphorus-containing epoxy resin, and the phosphorus-containing epoxy resin A having 60% solid content was obtained.

Synthesis Example 2

300 g of organic cyclic phosphorus-containing compound HCA was charged into a 3000 mL five-neck glass autoclave equipped with an electrically-heating mantle, a temperature-controlling apparatus, an electrically-driving stirrer, a stirring bar, a nitrogen inlet, a thermocouple, a water-cooling condenser and an addition funnel, and then the temperature was raised up to 120° C. under nitrogen atmosphere. After the HCA had completely dissolved, the reactants were dried under a vacuum, then nitrogen was let in and the container was evacuated again, which was repeated twice. After the temperature of the autoclave was cooled to 85 to 90° C., 1000 g of the epoxy resin 2 and 6.0 g of triphenylphosphine was added. The epoxy resin and triphenylphosphine were stirred by stirrer, and let the nitrogen flow in. Then, the mixture is heated up to 160° C. and maintained for 10 minutes. After the reaction had released heat slowly and the temperature was raised up to 180° C. and maintained for 3 hours, the phosphorus-containing epoxy resin B1 as obtained. The value of the epoxy equivalent weight of the phosphorus-containing epoxy resin B1 was 390; and the theoretical phosphorus content was 3.31 percent by weight. 867 g of methyl ethyl ketone was added into the obtained phosphorus-containing epoxy resin B1 to dissolve the phosphorus-containing epoxy resin, and the phosphorus-containing epoxy resin B1 having 60% solid content was obtained.

Synthesis Example 3

400 g of organic cyclic phosphorus-containing compound HCA was charged into a 3000 mL five-neck glass autoclave equipped with an electrically-heating mantle, a temperature-controlling apparatus, an electrically-driving stirrer, a stirring bar, a nitrogen inlet, a thermocouple, a water-cooling condenser and an addition funnel, and then the temperature was raised up to 120° C. under nitrogen atmosphere. After the HCA had completely dissolved, the reactants were dried under a vacuum, then nitrogen was let in and then the container was evacuated again, which was repeated twice. After the temperature of the autoclave was cooled to 85 to 90° C., 1000 g of the epoxy resin 2 and 6.0 g of triphenylphosphine were added. The epoxy resin and triphenylphosphine were stirred by stirrer, and nitrogen was let in. Then, the mixture was heated up to 160° C. and maintained for 10 minutes. After the reaction had released heat slowly, the temperature was raised up to 180° C. and maintained for 3 hours. The phosphorus-containing epoxy resin B2 was obtained. The value of the epoxy equivalent weight of the phosphorus-containing epoxy resin B2 was 390; and the theoretical phosphorus content was 4.10 percent by weight. 1400 g of methyl ethyl ketone was added into the obtained phosphorus-containing epoxy resin B2 to dissolve the phosphorus-containing epoxy resin, and the phosphorus-containing epoxy resin B2 having 50% solid content was obtained.

Synthesis Example 4

240 g of dianilinemethane, 228 g of phenol, 156.8 g of 92% paraformaldehyde and 300 g toluene were successively charged into a 1 L four-neck reaction vessel equipped with a stirrer, a thermometer, a pressure reducing system, and a condensing-heating mantle. After the reaction system was heated up to 50° C., the electric source for heating was removed. The reaction was conducted for 2.5 hours while maintaining the temperature in the range of 85 and 90° C. after the system released heat. Subsequently, in order to recover toluene, the internal pressure was reduced and the temperature was raised. After reaching 130° C. and more than 650 mm Hg of vacuum pressure, and recovering all of the toluene, the obtained product was dissolved by adding methyl ethyl ketone, and the synthesis resin C having 60% solid content was obtained.

Examples 1 to 4 and Comparative Examples 1 to 2

Components used in the listed amounts shown in Table 1 are formulated into epoxy resin varnishes in a vessel equipped with a stirrer and a condenser at room temperature.

TABLE 1

| Varnishes formula | Example 1 | Example 2 | Example 3 | Example 4 | Comparative Example 1 | Comparative Example 2 |
|---|---|---|---|---|---|---|
| Epoxy Resin A (g) | 240 | 240 | | | | |
| Epoxy Resin B1 (g) | | 54 | 230 | | 313 | 391 |
| Epoxy Resin B2 (g) | 50 | | | 252 | | |
| Synthesis Resin C (g) | 88 | 100 | 133 | 100 | | |
| Hardener A | | | | | 109 | |
| Hardener B | | | | | | 60 |
| Catalyst A | 1.0 | 1.0 | 0.8 | 0.63 | 0.28 | 0.49 |
| propylene glycol monomethyl ether | 17 | 27 | 25 | 0 | 0 | 0 |

A glass fiber cloth was impregnated in the phosphorus-containing epoxy resin varnish as formulated above, then dried at 170° C. to obtain prepreg. Eight pieces of the above prepreg were stacked up, and a sheet of 35 μm copper foil was placed on the top and bottom sides of the stack prepregs, then laminated at 200° C. under a pressure of 25 kg/cm$^2$ to form a laminated entity of the phosphorus-containing epoxy resin and the glass fiber cloths. According to the IPC-TM-650-2.4.25 and IPC-TM-650-2.4.8 standards, the glass transition temperature and the peeling strength of the laminated entities were determined respectively. According to the IPC-TM-650-2.5.17 standard, the surface resistance and the volume resistance were determined. According to the IPC-TM-650-2.5.5.4 standard, the dielectric constant and the dissipation factor were determined. The results are given in Table 2.

TABLE 2

| Test Item | Example 1 | Example 2 | Example 3 | Example 4 | Comparative Example 1 | Comparative Example 2 |
|---|---|---|---|---|---|---|
| Flame Retardant Test | passed | passed | passed | passed | passed | passed |
| Tg (° C.), TMA | 139° C. | 141° C. | 157° C. | 143° C. | 127° C. | 133.5° C. |

TABLE 2-continued

| Test Item | Example 1 | Example 2 | Example 3 | Example 4 | Comparative Example 1 | Comparative Example 2 |
|---|---|---|---|---|---|---|
| α 1 of TMA (ppm/° C.) | 39 | 44.2 | 14.9 | 82.2 | 83.7 | 119 |
| Solder Resistance (288° C.) | >180 sec. | >180 sec. | >180 sec. | >180 sec. | >180 sec. | >180 sec. |
| Peeling Strength (KN/m) | 1.2 | 1.3 | 1.0 | 1.0 | 0.9 | 0.9 |

From the results in Table 2, it can be seen that the flame retardant properties of the halogen-free resin composition of the invention can meet the UL 94V-0 standard without the addition of halogen-containing components. On the other hand, the halogen-free resin composition of the invention has relatively high heat resistance compared with the resin composition comprising the conventional hardener.

What is claimed is:

1. A halogen free resin composition, consisting essentially of:
   (A) one or more phosphorous-containing epoxy resins;
   (B) a hardener; and
   (C) a hardening accelerator; wherein the hardener of component (B) has the structure represented by the following formula (I):

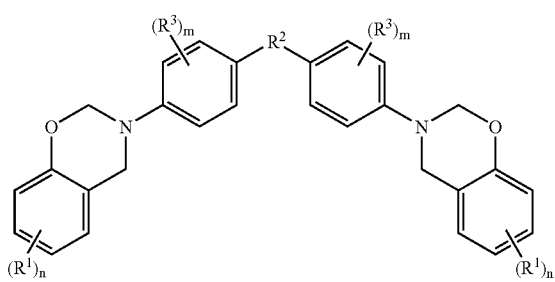

(I)

wherein, $R^1$ is a group selected from the group consisting of an alkyl group, an alkenyl group, an alkoxyl group, a hydroxy group, and an amino group; $R^2$ is a group selected from the group consisting of a chemical bond, an alkylene group, O, S, and $SO_2$; $R^3$ is H or an alkyl group; m and n are integers from 0 to 4.

2. The composition of claim 1, wherein $R^1$ is t-butyl; $R^2$ is methylene group; m is 0; and n is 1.

3. The composition of claim 1, wherein the hardener having the structure represented by the formula (I) is one prepared by the reaction of a phenolic compound, an aromatic diamine compound, and an aldehyde compound in the presence of a solvent.

4. The composition of claim 3, wherein the phenolic compound is t-butyl phenol; the aromatic diamine compound is 4,4'-diamino-diphenyl methane; the aldehyde compound is paraformaldehyde; and the solvent is aromatic hydrocarbon solvent.

5. The composition of claim 1, wherein the phosphorus-containing epoxy resin is a side chain type phosphorous-containing epoxy resin represented by the following formula (III):

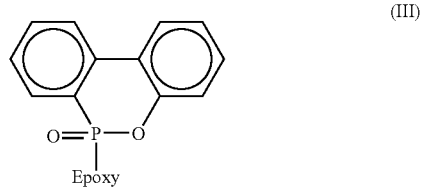

(III)

wherein Epoxy is one of the epoxy resin which one of epoxy groups is ring-opened.

6. The composition of claim 5, wherein the side chain type phosphorous-containing epoxy resin is one obtained by incorporating 9,10-dihydro-9-oxa-10-phosphorous phenanthrenyl-10-oxide into the structure of epoxy resin.

7. The composition of claim 1, wherein the phosphorus-containing compound is the side chain type phosphorous-containing epoxy resin represented by the following formula (IV):

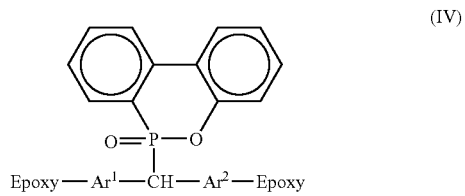

(IV)

wherein Epoxy is as defined above; and $Ar^1$ and $Ar^2$ are independently selected from:

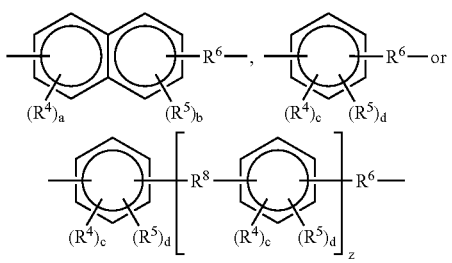

$R^4$ is selected from the group consisting of —OH, —COOH, —$NH_2$, —CHO, —SH, —$SO_3H$, —$CONH_2$, —$NHCOOR^7$, and anhydride; $R^5$ is selected from the group consisting of hydrogen, an alkyl group, an alkoxyl group, a nitro group, and an aryl group; $R^6$ is a chemical bond or an alkylene group; $R^7$ is hydrogen or alkyl group; $R^8$ is selected from the group consisting of a chemical bond, —CR$^5$R$^7$—, -O-, —CO—, —S—, —SO—, and —SO$_2$—; a and b are independent integers from 0 to 6, and a+b≦6; c and d are independent integers from 0 to 4, and c+d≦4; and z is an integer from 1 to 20.

8. The composition of claim 7, wherein the side chain type phosphorous-containing epoxy resin is one prepared by undergoing the addition reaction of 9,10-dihydro-9-oxa-10-phosphorous phenanthrenyl-10-oxide with an aromatic aldehyde compound and undergoing the condensation reaction with an aromatic compound having active hydrogen to produce a phosphorus-containing compound, and subsequently reacting the phosphorus-containing compound with an epoxy resin.

9. The composition of claim 8, wherein the aromatic aldehyde compound is 4-hydroxy benzaldehyde, and the aromatic compound having active hydrogen is phenol.

10. The composition of claim 6 or 8, wherein the epoxy resin is derived from the monomers selected from the group consisting of bisphenol glycidyl ether, biphenol glycidyl ether, dihydroxybenzene glycidyl ether, glycidyl ether containing nitrogen ring, glycidyl ether of dihydroxynaphthalene, phenolic polyglycidyl ether, and polyhydroxy glycidyl ether.

11. The composition of claim 1, wherein the one or more phosphorous-containing epoxy resins of component (A) are used in an amount of 40 to 80 wt % based on the total amount of the phosphorous-containing epoxy resins of component (A) and the hardener of component (B).

12. The composition of claim 1, wherein the hardening accelerator (C) is selected from the group consisting of tertiary amine, tertiary phosphine, quaternary ammonium salts, quaternary phosphonium salts, the complex salt of trifluoroboride, lithium compound, imidazole compound, and any mixture thereof.

13. The composition of claim 1, wherein the hardening accelerator of component (C) is used in 0.01 to 1 wt % based on the total amount of the resin composition.

14. The composition of claim 1, wherein the composition is useful in the application of adhesives, composite materials, laminated plates, printed circuit boards, copper foil adhesives, inks used for build-up process, and semiconductor packaging materials.

* * * * *